US012575371B2

(12) United States Patent
Lee et al.

(10) Patent No.: US 12,575,371 B2
(45) Date of Patent: Mar. 10, 2026

(54) METHOD FOR MANUFACTURING SEMICONDUCTOR PACKAGE AND PROTECTIVE FILM USED THEREFOR

(71) Applicant: SAMSUNG ELECTRONICS CO., LTD., Suwon-si (KR)

(72) Inventors: Seonho Lee, Cheonan-si (KR); Wonkeun Kim, Hwaseong-si (KR); Myoungchul Eum, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 577 days.

(21) Appl. No.: 17/740,649

(22) Filed: May 10, 2022

(65) Prior Publication Data

US 2023/0086253 A1 Mar. 23, 2023

(30) Foreign Application Priority Data

Sep. 17, 2021 (KR) ........................ 10-2021-0124642

(51) Int. Cl.
*H01L 21/683* (2006.01)
*C08L 29/04* (2006.01)
(Continued)

(52) U.S. Cl.
CPC .......... *H01L 21/6836* (2013.01); *C08L 29/04* (2013.01); *C08L 39/06* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 7,550,367 B2 * 6/2009 Tamura ............... H01L 21/6836
438/464
10,377,923 B2 8/2019 Ichioka et al.
(Continued)

FOREIGN PATENT DOCUMENTS

CN 205621713 U 10/2016
JP 4781765 B2 9/2011
(Continued)

OTHER PUBLICATIONS

Communication issued on Dec. 21, 2025 by the Korean Intellectual Property Office in Korean Patent Application No. 10-2021-0124642.

*Primary Examiner* — Wael M Fahmy
*Assistant Examiner* — Quinton A Brasfield
(74) *Attorney, Agent, or Firm* — Sughrue Mion, PLLC

(57) ABSTRACT

A method includes preparing a protective film including a base film and a protective layer laminated on a surface of the base film, mounting the protective film on a semiconductor wafer having a rear surface attached to a dicing tape and a front surface positioned opposite to the rear surface, the protective layer being disposed on the front surface, irradiating the rear surface of the semiconductor wafer with a dicing laser, removing the base film of the protective film from the semiconductor wafer, dividing the semiconductor wafer into individual semiconductor chips, and removing the protective layer from the individual semiconductor chips.

19 Claims, 7 Drawing Sheets

(51) Int. Cl.
| | |
|---|---|
| *C08L 39/06* | (2006.01) |
| *C08L 75/04* | (2006.01) |
| *C09J 133/08* | (2006.01) |
| *H01L 23/00* | (2006.01) |
| *H01L 25/065* | (2023.01) |
| *H10D 84/01* | (2025.01) |

(52) U.S. Cl.
CPC ............. *C08L 75/04* (2013.01); *C09J 133/08* (2013.01); *H01L 24/80* (2013.01); *H01L 24/95* (2013.01); *H10D 84/01* (2025.01); *H01L 24/08* (2013.01); *H01L 24/94* (2013.01); *H01L 25/0657* (2013.01); *H01L 2221/68327* (2013.01); *H01L 2221/6834* (2013.01); *H01L 2224/08145* (2013.01); *H01L 2224/80895* (2013.01); *H01L 2224/80896* (2013.01); *H01L 2224/95001* (2013.01); *H01L 2225/06524* (2013.01); *H01L 2225/06541* (2013.01); *H01L 2924/1431* (2013.01); *H01L 2924/1434* (2013.01)

(58) Field of Classification Search
CPC .. H01L 25/0756; H01L 25/112; H01L 25/117; H01L 2224/08145; H01L 27/0688; H01L 21/6836; H01L 2221/68304; H01L 2221/68327; H01L 24/94; H01L 24/95; H01L 21/78–786; H01L 21/02354; H01L 21/02675–02686; H01L 21/3043; H10D 62/50–57; H10D 89/011–015; B23K 26/00–70
See application file for complete search history.

(56) References Cited

U.S. PATENT DOCUMENTS

| | | | | |
|---|---|---|---|---|
| 10,916,439 | B2 * | 2/2021 | Yokoi | .................... H01L 21/78 |
| 11,282,736 | B2 * | 3/2022 | Matsubara | ......... H01L 21/6836 |
| 2008/0020575 | A1 | 1/2008 | Saimoto et al. | |
| 2010/0022071 | A1 * | 1/2010 | Arita | ...................... H01L 21/78 |
| | | | | 257/E21.599 |
| 2017/0282326 | A1 | 10/2017 | Ramos et al. | |
| 2020/0135594 | A1 * | 4/2020 | Lee | ......................... H01L 22/32 |
| 2022/0293424 | A1 * | 9/2022 | Sekiya | ............. H01L 21/67011 |
| 2022/0320036 | A1 * | 10/2022 | Gao | ................... H01L 21/6835 |

FOREIGN PATENT DOCUMENTS

| | | | | | |
|---|---|---|---|---|---|
| JP | | 2015-99825 | A | 5/2015 | |
| JP | | 2018-78162 | A | 5/2018 | |
| JP | | 6411142 | B2 | 10/2018 | |
| JP | | 2018162452 | A | 10/2018 | |
| JP | | 6522998 | B2 | 5/2019 | |
| KR | 10-2015-0140215 | | A | 12/2015 | |
| KR | 10-2016-0049041 | | A | 5/2016 | |
| WO | WO-2020195808 | | A1 * | 10/2020 | ........... H01L 21/304 |

* cited by examiner

S100

PREPARE PROTECTIVE FILM INCLUDING
BASE FILM AND PROTECTIVE LAYER          S110

MOUNT PROTECTIVE FILM ON
SEMICONDUCTOR WAFER          S120

IRRADIATE SEMICONDUCTOR
WAFER WITH LASER          S130

REMOVE BASE FILM FROM
SEMICONDUCTOR WAFER          S140

DIVIDE INDIVIDUAL SEMICONDUCTOR
CHIPS FROM SEMICONDUCTOR WAFER          S150

REMOVE PROTECTIVE LAYER FROM
SEMICONDUCTOR CHIPS          S160

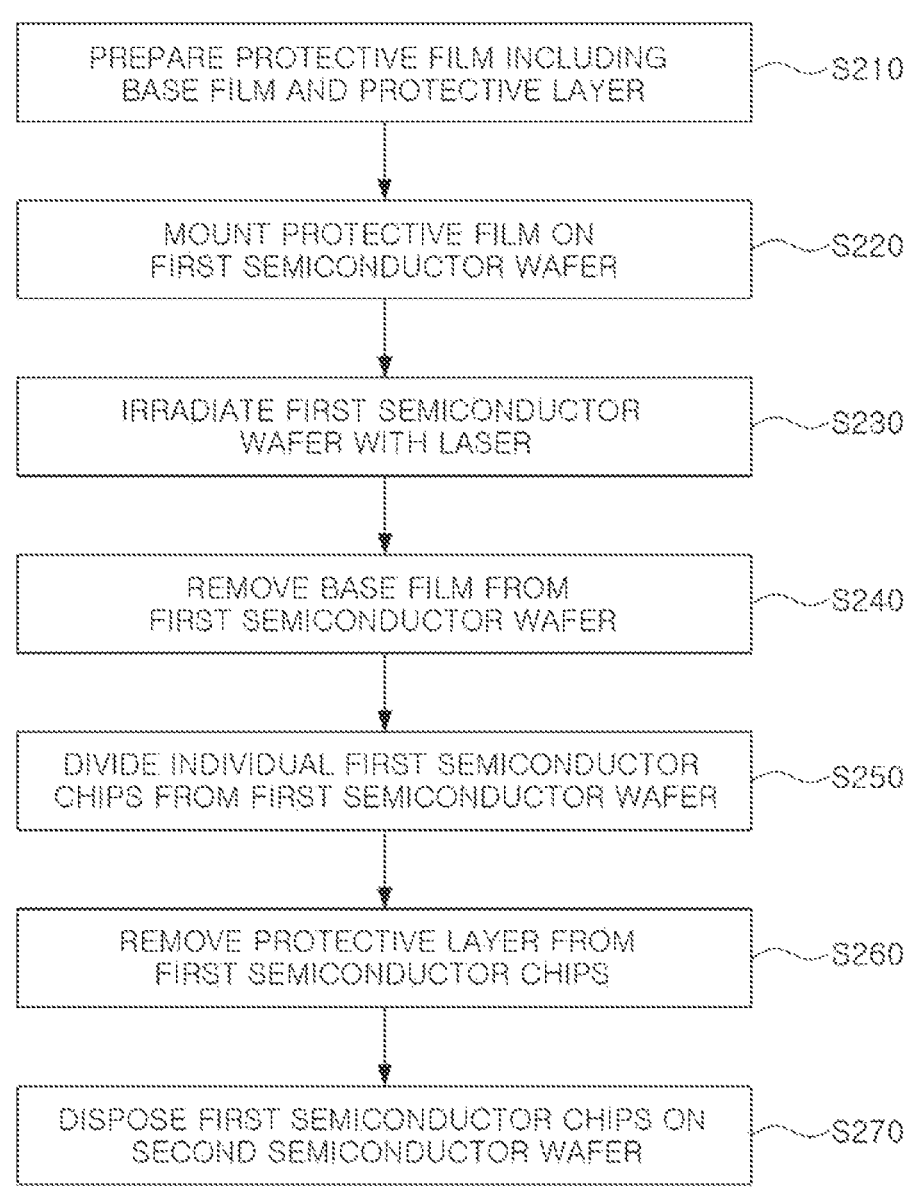

S200

PREPARE PROTECTIVE FILM INCLUDING
BASE FILM AND PROTECTIVE LAYER — S210

MOUNT PROTECTIVE FILM ON
FIRST SEMICONDUCTOR WAFER — S220

IRRADIATE FIRST SEMICONDUCTOR
WAFER WITH LASER — S230

REMOVE BASE FILM FROM
FIRST SEMICONDUCTOR WAFER — S240

DIVIDE INDIVIDUAL FIRST SEMICONDUCTOR
CHIPS FROM FIRST SEMICONDUCTOR WAFER — S250

REMOVE PROTECTIVE LAYER FROM
FIRST SEMICONDUCTOR CHIPS — S260

DISPOSE FIRST SEMICONDUCTOR CHIPS ON
SECOND SEMICONDUCTOR WAFER — S270

FIG. 8

METHOD FOR MANUFACTURING SEMICONDUCTOR PACKAGE AND PROTECTIVE FILM USED THEREFOR

CROSS-REFERENCE TO RELATED APPLICATION

This application claims priority to Korean Patent Application No. 10-2021-0124642 filed on Sep. 17, 2021 in the Korean Intellectual Property Office, the disclosure of which is incorporated by reference herein in its entirety.

BACKGROUND

The present disclosure relates to a method for manufacturing a semiconductor package and a protective film used therefor.

Recently, semiconductor packages having a high degree of integration as well as a high processing speed and a wide bandwidth by reducing a length of interconnections between stacked semiconductor chips using direct bonding may be provided. In order to implement direct bonding, it is advantageous to implement a technique for minimizing foreign matter adhering to a surface during a cutting process of semiconductor wafers.

SUMMARY

It is an aspect to provide a method for manufacturing a semiconductor package to simplify a process and minimize foreign matter on a surface of a semiconductor wafer, and a protective film used therein.

According to an aspect of one or more embodiments, there is provided a method comprising preparing a protective film including a base film and a protective layer laminated on a surface of the base film, mounting the protective film on a semiconductor wafer having a rear surface attached to a dicing tape and a front surface positioned opposite to the rear surface, the protective layer being disposed on the front surface, irradiating the rear surface of the semiconductor wafer with a dicing laser, removing the base film of the protective film from the semiconductor wafer, dividing the semiconductor wafer into individual semiconductor chips, and removing the protective layer from the individual semiconductor chips.

According to another aspect of one or more embodiments, there is provided a method comprising preparing a semiconductor wafer having a rear surface and a front surface positioned opposite to the rear surface, the semiconductor wafer including a rear pad adjacent to the rear surface, a front pad adjacent to the front surface, and a through-electrode electrically connecting the rear pad to the front pad; mounting a protective film including a base film and a protective layer on the semiconductor wafer such that the protective layer is disposed on the front surface of the semiconductor wafer; irradiating the rear surface of the semiconductor wafer with a dicing laser; removing the base film of the protective film from the semiconductor wafer; dividing the semiconductor wafer into individual semiconductor chips; and removing the protective layer from the individual semiconductor chips.

According to yet another aspect of one or more embodiments, there is provided a method comprising preparing a first semiconductor wafer having a first rear surface and a first front surface positioned opposite to the first rear surface, the first semiconductor wafer comprising a first front pad to be disposed on the first front surface; mounting a protective film including a base film and a protective layer on the first semiconductor wafer such that the protective layer is disposed on the first front surface of the first semiconductor wafer; irradiating the first rear surface of the first semiconductor wafer with a dicing laser; removing the base film of the protective film from the first semiconductor wafer; dividing the first semiconductor wafer into first semiconductor chips; removing the protective layer from the first semiconductor chips; and disposing the first semiconductor chips on a second semiconductor wafer having a second rear surface and a second front surface opposite to the second rear surface, the second semiconductor wafer including a second rear pad disposed on the second rear surface and a second front pad disposed on the second front surface, the first front pad being in direct contact with the second rear pad or with the second front pad.

According to yet another aspect of one or more embodiments, there is provided a protective film of a semiconductor wafer, the protective film including a base film and a protective layer laminated on a surface of the base film, wherein the protective layer includes polyvinylalcohol (PVA), pyrrolidone (PVP), or an ionic polymer.

BRIEF DESCRIPTION OF DRAWINGS

The above and other aspects will be more clearly understood from the following detailed description, taken in conjunction with the accompanying drawings, in which:

FIG. 8 is a process flowchart illustrating a method for manufacturing a semiconductor package according to an embodiment;

DETAILED DESCRIPTION

Hereinafter, various example embodiments will be described with reference to the accompanying drawings.

Figure 1:
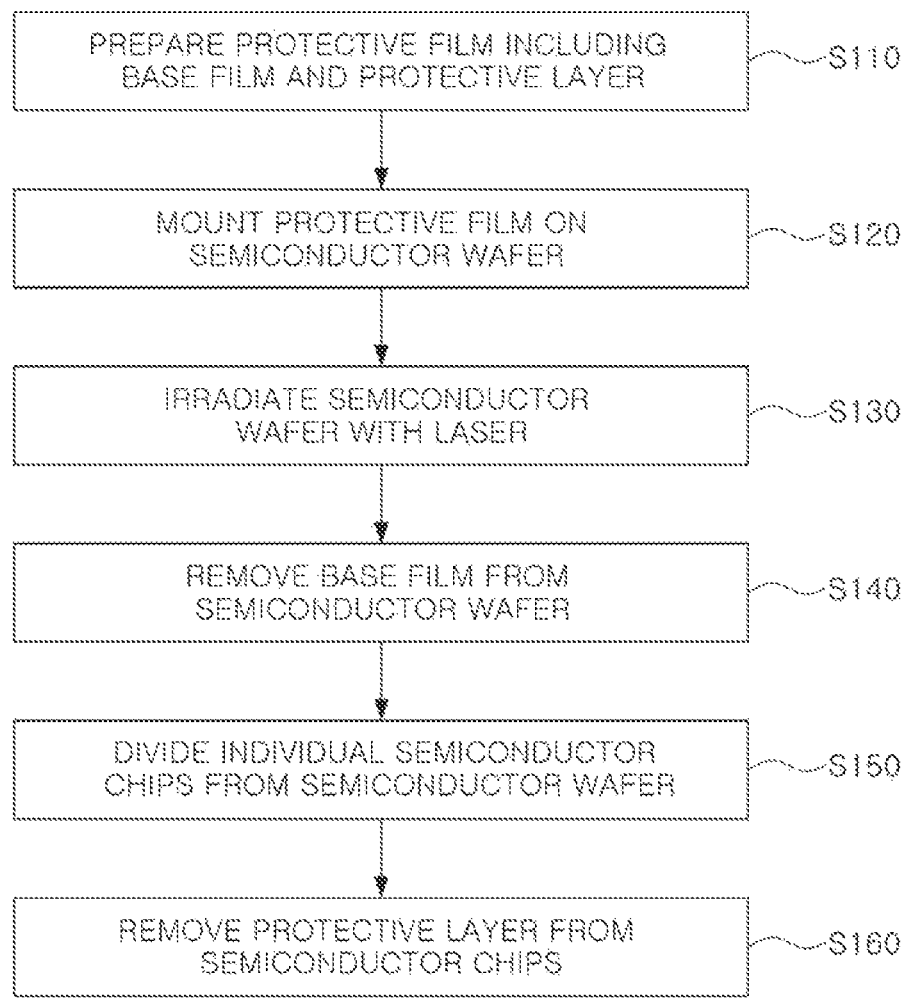
FIG. 1 is a process flowchart illustrating a method for manufacturing a semiconductor package according to an embodiment.

FIG. 1 is a process flowchart illustrating a method (S100) of manufacturing a semiconductor package according to an embodiment, and FIGS. 2 to 7 are cross-sectional views illustrating a manufacturing process according to the method (S100) of manufacturing a semiconductor package of FIG. 1, according to various embodiments.

Figure 2:
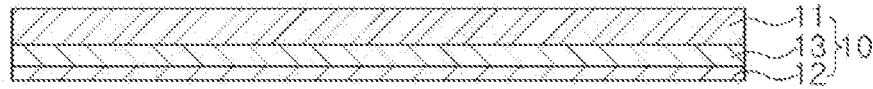
FIGS. 2 to 7 are cross-sectional views illustrating a sequential process of the method for manufacturing a semiconductor package of FIG. 1, according to various embodiments.

First, referring to FIGS. 1 and 2, a protective film 10 including a base film 11 and a protective layer 12 may be prepared (S110). For example, the protective film 10 may include the protective layer 12 laminated on a surface of the base film 11.

In some embodiments, using the protective film 10 including the base film 11 for protecting a surface of a semiconductor wafer fixed to a chuck and the protective layer 12 for preventing attachment of foreign matter (e.g., silicon residues) on a surface of a semiconductor wafer, a process of attaching the base film 11 and a process of coating the protective layer 12 may be performed as a single process. Therefore, the process may be simplified so that manufacturing costs of the semiconductor package may be reduced and foreign matter on the surface of the semiconductor wafer may be minimized. In addition, in the case of direct bonding between a semiconductor wafer and a semiconductor chip, between semiconductor chips, or between semiconductor wafers using a semiconductor wafer and/or semiconductor chips having a minimized surface foreign matter, defects (e.g., void occurrence) caused by foreign matter attached to the surface may be prevented.

The base film 11 may be a support for the protective layer 12, and may be separated from the protective layer 12 by UV irradiation, heating, or pressure. The base film 11 may be formed of a resin film, and a resin constituting the base film 11 is not particularly limited. For example, the base film 11 may include at least one of polyolefin (PO), polyethylene terephthalate (PET), polyethylene naphthalate (PEN), polyethylene ether ketone (PEEK), polyimide (PI), polyvinyl chloride (PVC), or ethylenevinyl acetate (EVA). The base film 11 may be formed in various thicknesses. For example, in some embodiments, the base film 11 may have a thickness in the range of about 10 μm to about 200 μm.

The protective layer 12 may be provided in a laminated state on the base film 11, and may be formed by forming and curing a thermosetting resin or by forming a thermoplastic resin into a film. The protective layer 12 may be formed using a resin capable of securing adhesion to the base film 11 and to a semiconductor wafer (100W in FIG. 3) and capable of preventing intrusion of foreign matter, and having cleaning properties after cutting the semiconductor wafer. For example, the protective layer 12 may include an oil-soluble resin or a water-soluble resin. The protective layer 12 may be formed in various thicknesses. For example, in some embodiments, the protective layer 12 may have a thickness ranging from about 1 μm to about 50 μm.

The oil-soluble resin may include a polyurethane resin including an urea group in which alcohol or amine is polymerized by reacting with isocyanate, or a thermoplastic resin such as polystyrene (PS), polyethylene terephthalate (PET), or polypropylene (PP). In some embodiments, the thermoplastic resin may have a molecular weight in the range of about 1000 Mw to 100000 Mw.

The water-soluble resin may include polyvinyl alcohol (PVA), polyvinyl pyrrolidone (PVP), or an ionic polymer having an ionic functional group.

According to an embodiment, the protective film 10 may further include an adhesive layer 13 disposed between the base film 11 and the protective layer 12. The adhesive layer 13 may fix the base film 11 and the protective layer 12, and may be separated along with the base film 11 from the protective layer 12 in the process of removing the base film 11 (see FIG. 5). The adhesive layer 13 may include, for example, a rubber-based, acrylic-based, silicone-based, polyvinyl ether-based adhesive, and the like. According to an embodiment, the adhesive layer 13 may be a ultraviolet (UV)-curable adhesive in which a UV curing component or the like is included in an acrylic adhesive or the like. In this case, additives such as a crosslinking agent, a tackifier, a filler, an antiaging agent, and a colorant may be further included. The UV curing component may be, for example, a monomer, oligomer, or polymer that has a carbon-carbon double bond in a molecule and is curable by radical polymerization. In some embodiments, the adhesive layer 13 may have a thickness in the range of about 1 μm to about 50 μm.

Figure 3:
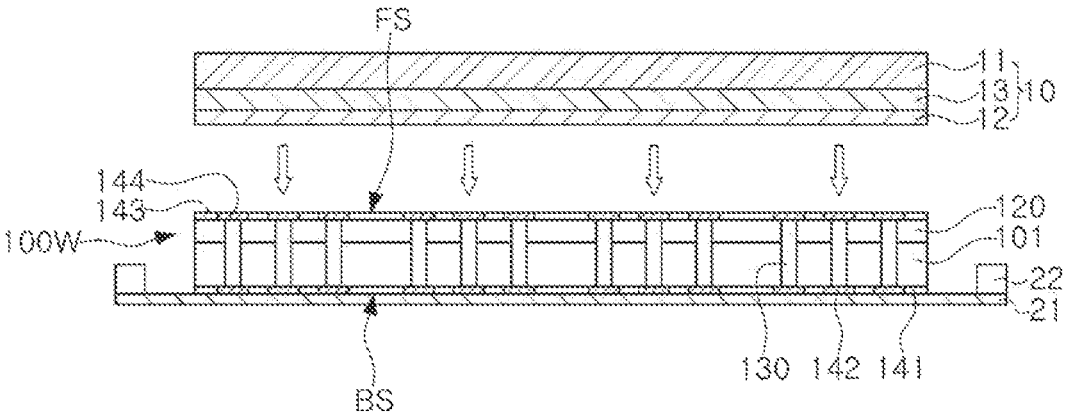

Next, referring to FIGS. 1 and 3, the protective film 10 may be mounted on a semiconductor wafer (S120). For example, as illustrated in FIG. 3, the protective film 10 that has been prepared may be mounted on a semiconductor wafer 100W having a rear surface BS attached to a dicing tape 21 and a front surface FS positioned opposite to the rear surface BS so that the protective layer 12 faces the front surface FS. According to an embodiment, the front surface FS of the semiconductor wafer 100W may be attached to the dicing tape 21. The dicing tape 21 may be supported and fixed by a ring frame 22 attached to a surface of the dicing tape 21. The semiconductor wafer 100W may be in a state in which components for semiconductor chips are formed. For example, the semiconductor wafer 100W may include a semiconductor substrate 101, a circuit layer 120, a rear pad 142 adjacent to the rear surface BS, a front pad 144 adjacent to the front surface FS, a rear insulating layer 141, a front insulating layer 143, and a through-electrode 130.

The semiconductor substrate 101 may include, for example, a semiconductor element such as silicon or germanium (Ge), or a compound semiconductor such as silicon carbide (SiC), gallium arsenide (GaAs), indium arsenide (InAs), or indium phosphide (InP). The semiconductor substrate 101 may have an active surface on which an active region is disposed and an inactive surface opposite to the active surface.

The circuit layer 120 may be disposed adjacent to the front surface FS on the active surface of the semiconductor substrate 101 and may include various discrete devices (not shown), a dielectric layer covering the discrete devices, and a wiring layer (not shown) connecting the discrete devices to each other, connecting the discrete devices to the active region, and/or connecting the discrete devices to the through-electrode 130.

The rear insulating layer 141 may surround the rear pad 142 and provides a rear surface BS of the semiconductor wafer 100W together with a surface of the rear pad 142, and the front insulating layer 143 may surround the front pad 144 and provide a front surface FS of the semiconductor wafer 100W together with a surface of the front pad 144. The rear insulating layer 141 and the front insulating layer 143 may include silicon oxide. The rear pad 142 and the front pad 144 may include, for example, at least one of aluminum (Al), copper (Cu), nickel (Ni), tungsten (W), platinum (Pt), or gold (Au). On the other hand, although not shown in the drawings, an insulating protective film surrounding a portion of the through-electrode 130 and electrically insulating the rear pad 142 and the semiconductor substrate 101 may be disposed between the semiconductor substrate 101 and the rear pad 142. The insulating protective film may be formed of an insulating layer such as a silicon oxide film, a silicon nitride film, or a silicon oxynitride film.

In some embodiments, the semiconductor wafer 100W may be in a state in which a back-grinding process of processing the semiconductor substrate 101 opposite to the circuit layer 120 has been completed. That is, both the front pad 144 and the rear pad 142 may be in a completed state. In some embodiments, the through-electrode 130, the rear insulating layer 141, and the rear pad 142 may be omitted from the semiconductor wafer 100W, and even in a case in which the through-electrode 130, the rear insulating layer 141, and the rear pad 142 are omitted, the so-called back-grinding process may be completed. For example, in some embodiments, a thickness of the semiconductor wafer 100W may be about 100 μm or less, but is not limited thereto. Also, according to an embodiment, the semiconductor wafer 100W may be provided for a silicon interposer substrate, and in this case, the circuit layer 120 may not include a discrete device, for example, an active device such as a transistor. In other words, in some embodiments, the discrete device may be omitted from the circuit layer 120.

Figure 4:
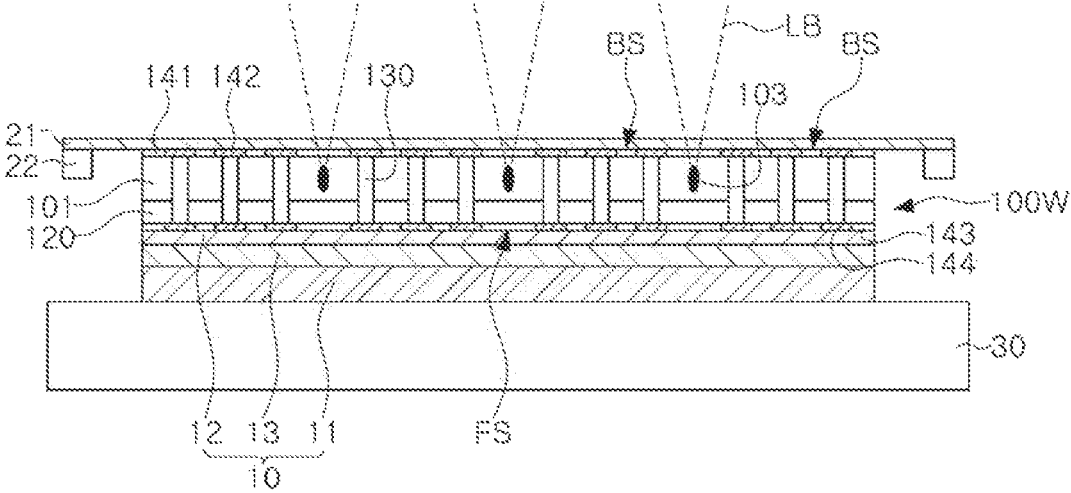

Next, referring to FIGS. 1 and 4, the semiconductor wafer may be irradiated with a laser (S130). For example, as illustrated in FIG. 4, in some embodiments, a laser for dicing of the semiconductor wafer 100W may be irradiated onto the semiconductor wafer 100W. For example, the protective film 10 may be supported on a chuck 30, and a laser beam LB may be irradiated onto the rear surface BS of the semiconductor wafer 100W attached to the dicing tape 21. The laser beam LB may have a wavelength that may pass through the semiconductor wafer 100W and may be focused on a point inside the semiconductor wafer 100W to form a deformation region 103. In some embodiments, the point may be located in the semiconductor substrate 101 so as to be spaced apart from the back surface BS and from a junction between the semiconductor substrate 101 and the circuit layer 120. For example, the deformation region 103 may be formed as a material in the semiconductor wafer 100W is partially melted, and in an operation of expanding the dicing tape 21 (see FIG. 6), the semiconductor wafer 100W may be split based on the deformation region 103 as a starting point.

Figure 5:
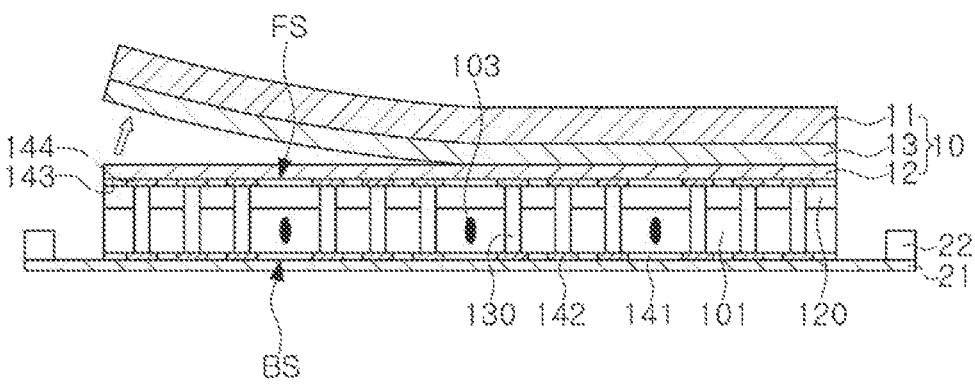

Next, referring to FIGS. 1 and 5, the base film 11 of the protective film 10 may be removed from the semiconductor wafer 100W (S140). According to some embodiments, when the adhesive layer 13 is interposed between the base film 11 and the protective layer 12, the adhesive layer 13 may be removed together with the base film 11 as illustrated in FIG. 5. The base film 11 and/or the adhesive layer 13 may be separated from the protective layer 12 by UV irradiation, heating, or pressure.

Figure 6:
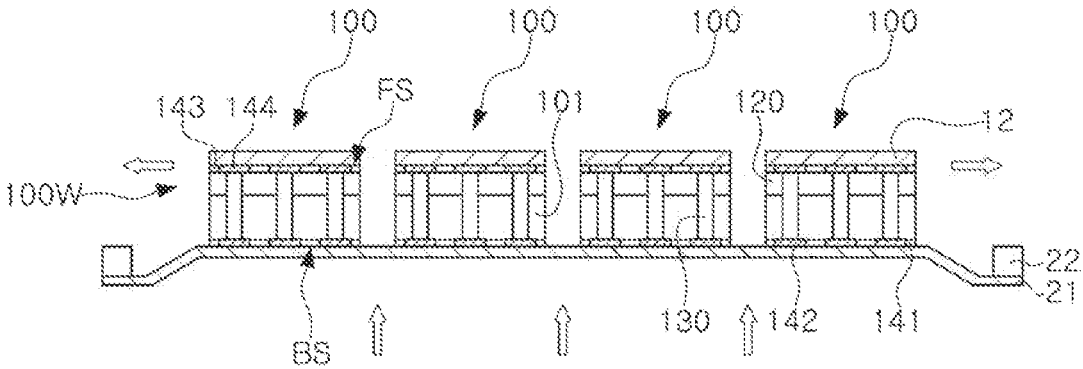

Next, referring to FIGS. 1 and 6, individual semiconductor chips may be divided from the semiconductor wafer 100W (S150). In some embodiments, the dicing tape 21 may be expanded so that individual semiconductor chips 100 are divided from the semiconductor wafer 100W as illustrated in FIG. 6. For example, the dicing tape 21 may be placed on a jig to apply upward pressure (as indicated by upward arrows in FIG. 6) to the rear surface BS, and the dicing tape 21 may be expanded by pushing the jig upward such that the front surface FS is moved in a lateral direction (as indicated by lateral arrows in FIG. 6) to pull apart the individual semiconductor chips 100. Accordingly, the semiconductor wafer 100W may be divided into individual semiconductor chips 100 starting from the deformation region 103 formed in the process of FIG. 4. In this case, the protective layer 12 may be divided together with the semiconductor wafer 100W and remain on the individual semiconductor chips 100 as illustrated in FIG. 6. Accordingly, the protective layer 12 may prevent foreign matter from adhering to the surface of the semiconductor wafer 100W or the semiconductor chips 100, for example, the front surface FS, during the dividing process of the semiconductor wafer 100W. As described above, according to various embodiments, since the protective layer 12 is transferred by the base film 11 without a process of coating the protective layer 12 on the semiconductor wafer 100W, a manufacturing process may be simplified and adsorption of foreign matter during the dicing process may be prevented.

6

Figure 7:
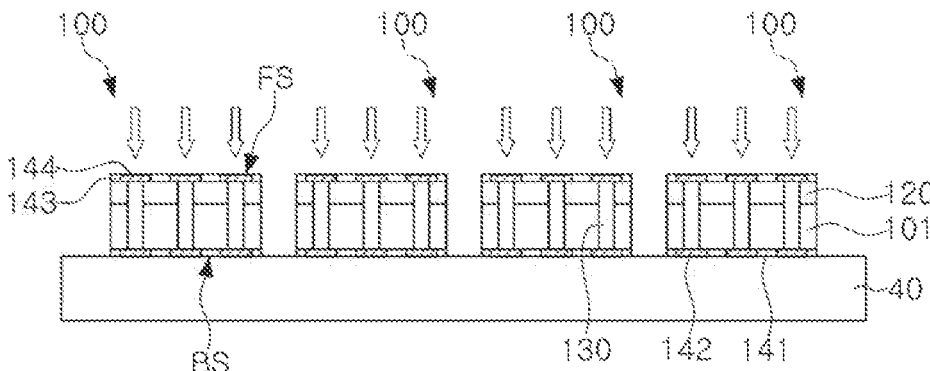

Finally, referring to FIGS. 1 and 7, the protective layer 12 may be removed from the semiconductor chips 100 (S160). For example, the protective layer 12 may be removed from the semiconductor chips 100 to expose the front surfaces FS of the semiconductor chips 100 as illustrated in FIG. 7. For example, before removing the protective layer 12, the semiconductor chips 100 may be picked up and transferred to a separate support substrate 40. The support substrate 40 may be a temporary carrier for supporting and fixing the semiconductor chips 100 before performing a die attaching process. The protective layer 12 may be peeled off by a film peeler or removed by a wet cleaning process. The wet cleaning process may be performed using an organic solvent or an inorganic solvent depending on a material of the protective layer 12.

As described above, in the method for manufacturing a semiconductor package according to an various embodiments, using the protective film 10 including the protective layer 12, the process of attaching the base film 11 and the process of coating the protective layer 12 may be performed as a single process and adsorption of foreign matter to the surface of the semiconductor wafer 100W may be minimized. Accordingly, the manufacturing cost of the semiconductor package may be reduced, and in the case of forming direct bonding, defects (e.g., void occurrence) due to foreign matter may be prevented.

Figure 9:
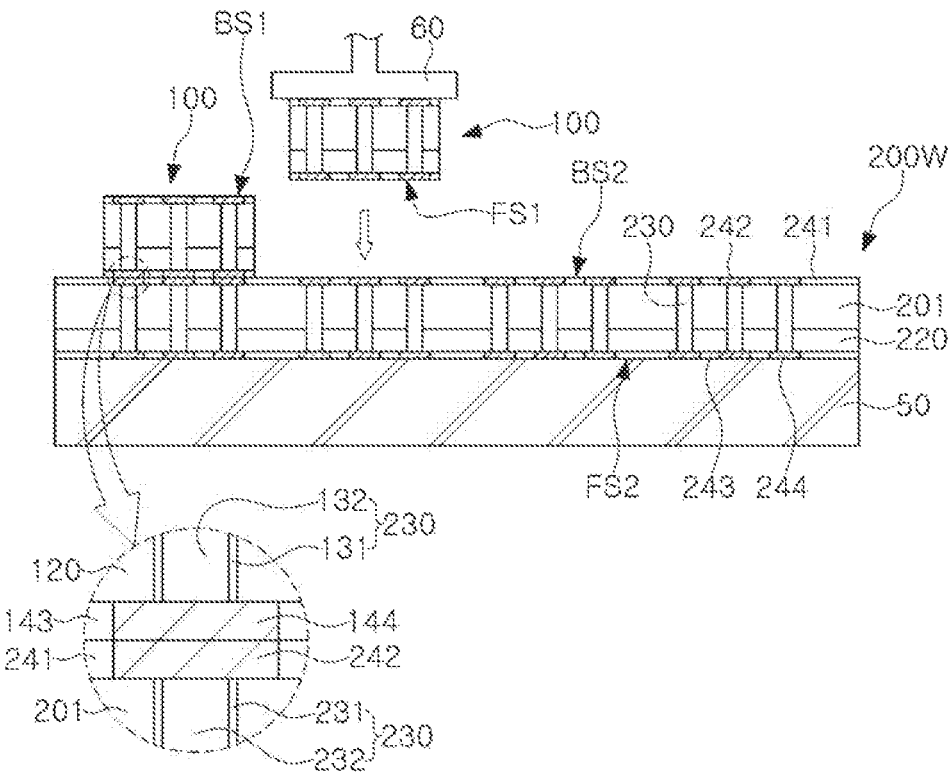
FIG. 9 is a cross-sectional view illustrating a partial manufacturing process of a method for manufacturing a semiconductor package of FIG. 8, according to various embodiments.

FIG. 8 is a process flowchart illustrating a method (S200) of manufacturing a semiconductor package according to an embodiment, and FIG. 9 is a cross-sectional view illustrating a partial manufacturing process of the method (S200) of manufacturing a semiconductor package of FIG. 8, according to an embodiment.

Referring to FIG. 8, the method (S200) of manufacturing a semiconductor package of the embodiment illustrated in FIG. 8 includes an operation (S210) of preparing a protective film including a base film and a protective layer, an operation (S220) of mounting the protective film on a first semiconductor wafer (here, the first semiconductor wafer may correspond to the semiconductor wafer 100W described above), an operation (S230) of irradiating a laser on the first semiconductor wafer, an operation (S240) of removing the base film from the first semiconductor wafer, an operation (S250) of dividing individual first semiconductor chips from the first semiconductor wafer (here, the first semiconductor chips may correspond to the semiconductor chips 100 described above), an operation (S260) of removing the protective layer from the first semiconductor chips, and an operation (S270) of disposing the first semiconductor chips on a second semiconductor wafer. Here, since the operations other than the operation (S270) of disposing the first semiconductor chips on the second semiconductor wafer have characteristics the same as or similar to those described above with reference to FIGS. 1 to 7, the same description of like operations applies and redundant descriptions thereof will be omitted for conciseness. That is, the manufacturing method S200 of the embodiment illustrated in FIG. 8 includes an operation (see FIG. 9) of forming direct bonding by attaching the first semiconductor chips 100 formed by the manufacturing method (S100) of FIGS. 1 to 7 on a second semiconductor wafer 200W.

Referring to FIG. 9, first semiconductor chips 100 may be disposed on the second semiconductor wafer 200W. The second semiconductor wafer 200W may be fixed on a carrier substrate 50 by a bonding material layer (not shown). The second semiconductor wafer 200W may include a second semiconductor substrate 201, a second circuit layer 220, a second rear pad 242 adjacent to a second rear surface BS2, a second front pad 244 adjacent to a second front surface FS2, a second rear insulating layer 241, a second front insulating layer 243, and a second through-electrode 230. The second semiconductor wafer 200W may have the same or similar characteristics as the first semiconductor wafer 100W described above with reference to FIGS. 1 and 3 and thus descriptions of like components applies and repeated description thereof is omitted for conciseness. The second through-electrode 230 may include a second via plug 232 and a second side insulating layer 231 surrounding a side surfaces of the second via plug 232, and similarly, the first through-electrode 130 may also include a first via plug 132 and a first side insulating layer 131.

The first semiconductor chips 100 may be disposed on the first semiconductor wafer 200W using a pick-and-place device 60. For example, the first semiconductor chips 100 may be disposed such that a first front surface FS1 of the first semiconductor chips 100 faces the second rear surface BS2 of the second semiconductor wafer 200W. For example, the first semiconductor chips 100 may include a first front insulating layer 143 that surrounds the first front pad 144 and provides the first front surface FS1. Here, the first front insulating layer 143 and the first front pad 144 may correspond to similar structures having the reference designators in the embodiment described with reference to FIGS. 1-7. The second semiconductor wafer 200W may include the second rear insulating layer 241 surrounding the second rear pad 242 and providing the second rear surface BS2, and the second front insulating layer 243 surrounding the second front pad 244 and providing the second front surface FS2. In this case, the first semiconductor chips 100 may be disposed such that the first front pad 144 is in direct contact with the second rear pad 242 and the first front insulating layer 143 is in direct contact with the second rear insulating layer 241. It is noted that in other embodiments in which the first semiconductor chips 100 are disposed such that the first front surface FS1 of the first semiconductor chips 100 are disposed on the second front surface FS2 of the second semiconductor wafer 200W the first semiconductor chips 100 may be disposed such that the first front pad 144 is in direct contact with the second front pad 244 and the first front insulating layer 143 is in direct contact with the second front insulating layer 243. However, according to various embodiments, a vertical direction of the first semiconductor chip 100 and the second semiconductor wafer 200W may be combined differently from that illustrated in the drawings. For example, the first semiconductor chips 100 may be disposed such that the first rear surface BS1 is in contact with the second front surface FS2 of the second semiconductor wafer 200W.

The first front pad 144 and the second rear pad 242 or the second front pad 244, and the first front insulating layer 143 and the second rear insulating layer 241 or the second front insulating layer 243 may be bonded and combined by applying pressure in a temperature atmosphere higher than room temperature. For example, in some embodiments, the pressure may be applied in a temperature atmosphere of about 200° C. to about 300° C. Here, the temperature atmosphere is not limited to about 200° C. to about 300° C. and may be variously changed.

As described above, according to various embodiments, since the first semiconductor chips 100 have a surface on which adsorption of foreign matter is minimized, for example, the first front surface FS1, defects may be reduced in the process of forming direct bonding with the second semiconductor wafer 200W and process yield may be improved.

Figure 10:
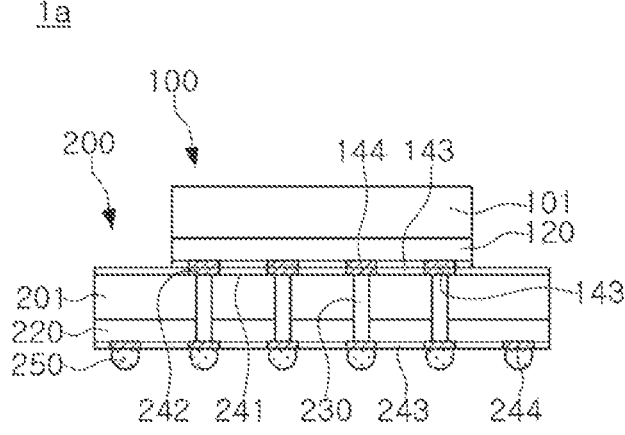
FIG. 10 is a cross-sectional view illustrating an example of a semiconductor package manufactured according to embodiments.

FIG. 10 is a cross-sectional view illustrating an example of a semiconductor package 1a manufactured according to various embodiments.

Referring to FIG. 10, the semiconductor package 1a according to an embodiment may include a first semiconductor chip 100 and a second semiconductor chip 200 bonded in a direct bonding structure. The first and second semiconductor chips 100 and 200 may be manufactured and bonded through the processes described above with reference to FIGS. 1 to 9, and each component may have the same or similar characteristics as those described above and accordingly similar descriptions apply and repeated description is omitted for conciseness. An external connection terminal 250 may be disposed below the second semiconductor chip 200. The external connection terminal 250 may be electrically connected to a wiring layer inside the second circuit layer 220 or to the second through-electrode 230. The external connection terminal 250 may be formed of a solder ball, but may have a bump structure using a pillar and solder according to an embodiment. The semiconductor package 1a may be mounted on an external device, for example, a main board, a package substrate, an interposer substrate, or the like through the external connection terminal 250.

According to some embodiments, a plurality of first semiconductor chips 100 may be mounted on the second semiconductor chip 200 in a vertical or horizontal direction. For example, the first semiconductor chip 100 and the second semiconductor chip 200 may be chiplets including an input/output (I/O), a central processing unit (CPU), a graphics processing unit (GPU), and a field programmable gate array (FPGA) chips constituting a multi-chip module (MCM). Also, as an example, the first semiconductor chip 100 may be a memory chip such as DRAM, SRAM, PRAM, MRAM, FeRAM, or RRAM, and the second semiconductor chip 200 may be a logic chip including a CPU, a GPU, an FPGA, an application processor (AP), a digital signal processor (DSP), a cryptographic processor, a microprocessor, a microcontroller, an analog-to-digital converter (ADC), an application specific integrated circuits (ASIC), etc. Also, as an example, the second semiconductor chip 200 may be an active interposer performing a function of an I/O chip, and in this case, the second semiconductor chip 200 may include an I/O device, a DC/DC converter, a sensor, a test circuit, etc.

Figure 11:
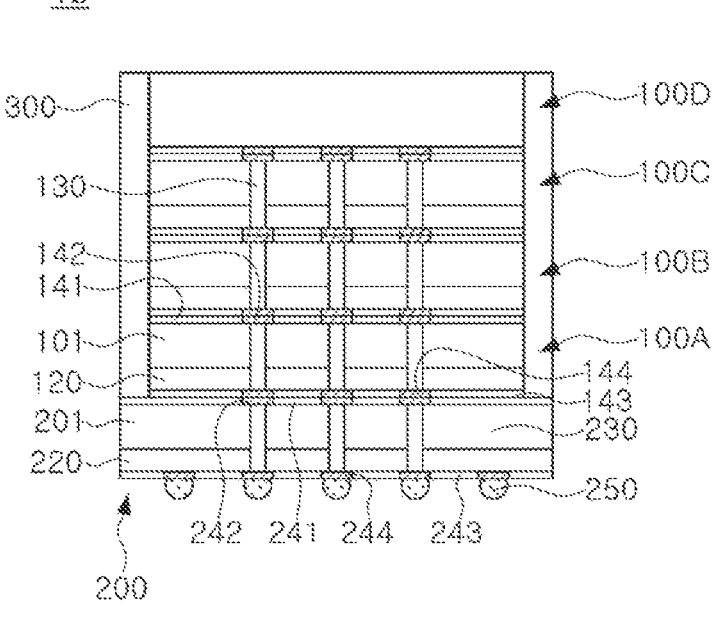
FIG. 11 is a cross-sectional view illustrating an example of a semiconductor package manufactured according to embodiments.

FIG. 11 is a cross-sectional view illustrating an example of a semiconductor package 1b manufactured according to various embodiments.

Referring to FIG. 11, a semiconductor package 1b may include first semiconductor chips 100A, 100B, 100C, 100D, a second semiconductor chip 200, and a molding member 300 bonded in a direct bonding structure. According to an embodiment, the number of first semiconductor chips 100A, 100B, 100C, and 100D may be greater or less than that shown in FIG. 11. For example, three or less or five or more first semiconductor chips may be stacked on the second semiconductor chip 200. The first semiconductor chips 100A, 100B, 100C, and 100D, and the second semiconductor chip 200 may be manufactured and bonded through the process described above with reference to FIGS. 1 to 9, and each component may have characteristics the same as or similar to those described above and accordingly similar descriptions apply and repeated description is omitted for conciseness. The molding member 300 may be disposed on the second semiconductor chip 200 and may seal at least a portion of each of the first semiconductor chips 100A, 100B, 100C, and 100D. As shown in FIG. 11, the molding member 300 may be formed to expose an upper surface of the uppermost first semiconductor chip 100D. However, according to some embodiments, the molding member 300 may be formed to cover the upper surface of the uppermost first semiconductor chip 100D. The molding member 300 may include, for example, an epoxy mold compound (EMC), but the material of the molding member 300 is not particularly limited.

In some embodiments, the second semiconductor chip 200 may be a buffer chip or a control chip including a plurality of logic devices and/or memory devices in a device layer 210. The second semiconductor chip 200 may transmit signals from the first semiconductor chips 100A, 100B, 100C, and 100D stacked thereon to the outside, and also transmit signals and power from the outside to the first semiconductor chips 100A, 100B, 100C, and 100D. The first semiconductor chips 100A, 100B, 100C, and 100D may include volatile memory devices such as DRAM and SRAM, or non-volatile memory devices such as PRAM, MRAM, FeRAM, or RRAM. In this case, the semiconductor package 1b may be used for a high bandwidth memory (HBM) product, an electro data processing (EDP) product, or the like.

Figure 12:
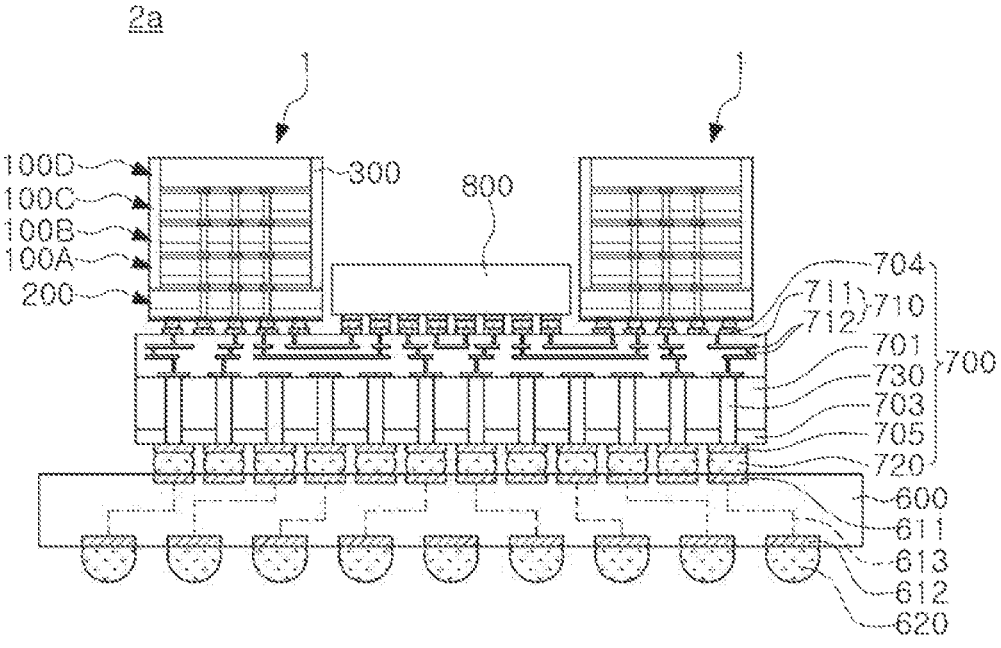
FIG. 12 is a cross-sectional view illustrating an example of a semiconductor package manufactured according to embodiments.

FIG. 12 is a cross-sectional view illustrating an example of a semiconductor package 2a manufactured according to various embodiments.

Referring to FIG. 12, the semiconductor package 2a may include a package substrate 600, an interposer substrate 700, and at least one chip structure 1. In addition, the semiconductor package 2a may further include a logic chip or a processor chip 800 disposed adjacent to the chip structure 1 on the interposer substrate 700.

The chip structure 1 may be manufactured and bonded through the process described above with reference to FIGS. 1 to 9, like the semiconductor packages 1a and 1b described above with reference to FIGS. 10 and 12, and each component may have characteristics the same as or similar to those described above and accordingly similar descriptions apply and repeated description is omitted for conciseness.

The package substrate 600 may be a support substrate on which the interposer substrate 700, the logic chip 800, and the chip structure 1 are mounted, and may be a substrate for a semiconductor package including a printed circuit board (PCB), a ceramic substrate, a glass substrate, a tape wiring board, or the like. A body of the package substrate 600 may include different materials according to a type of the substrate. For example, when the package substrate 600 is a PCB, the package substrate 600 may be in a form in which a wiring layer is additionally stacked on one side or both sides of a body copper clad laminate or a copper clad laminate.

The interposer substrate 700 may include a substrate 701, a lower protective layer 703, a lower pad 705, an interconnect structure 710, a metal bump 720, and a through-via 730. The chip structure 1000 and the processor chip 800 may be stacked on the package substrate 600 via the interposer substrate 700. The interposer substrate 700 may electrically connect the chip structure 1000 and the processor chip 800 to each other.

The substrate 701 may be formed of, for example, any one of silicon, an organic material, plastic, or a glass substrate. When the substrate 701 is a silicon substrate, the interposer substrate 700 may be referred to as a silicon interposer and may be manufactured through the process described above with reference to FIGS. 1 to 7. Unlike the drawings, when the substrate 701 is an organic substrate, the interposer substrate 700 may be referred to as a panel interposer.

A lower protective layer 703 may be disposed on a lower surface of the substrate 701, and a lower pad 705 may be disposed on the lower protective layer 703. The lower pad 705 may be connected to a through-via 730. A chip structure 1000 and a processor chip 800 may be electrically connected to the package substrate 600 through the metal bumps 720 disposed on the lower pad 705.

The interconnect structure 710 may be disposed on an upper surface of the substrate 701, and may include an interlayer insulating layer 711 and a single-layer or multi-layer wiring structure 712. When the interconnect structure 710 has a multi-layer wiring structure, wiring patterns of different layers may be connected to each other through contact vias.

The through-via 730 may extend from an upper surface to a lower surface of the substrate 701 to penetrate through the substrate 701. In addition, the through-via 730 may extend into the interconnect structure 710 to be electrically connected to wirings of the interconnect structure 710. When the substrate 701 is silicon, the through-via 730 may be referred to as a TSV. In some embodiments, the interposer substrate 700 may include only an interconnect structure therein, and a through-via may be omitted.

The interposer substrate 700 may be used for the purpose of converting or transferring an input electrical signal between the package substrate 600 and the chip structure 1000 or the processor chip 800. Accordingly, in some embodiments, the interposer substrate 700 may omit elements such as active elements or passive elements. Also, according to some embodiments, the interconnect structure 710 may be disposed below the through-via 730. For example, a positional relationship between the interconnect structure 710 and the through-via 730 may be relative.

The metal bump 720 may be disposed on a lower surface of the interposer substrate 700 and may be electrically connected to the wiring of the interconnect structure 710. The interposer substrate 700 may be stacked on the package substrate 600 through the metal bump 720. The metal bump 720 may be connected to the lower pad 705 through wirings of the interconnect structure 710 and the through-via 730. In an example, some of the lower pads 705 used for power or ground may be integrated and connected together to the metal bump 720, so that the number of the lower pads 705 may be greater than that of the metal bump 720.

The logic chip or processor chip 800 may include, for example, a CPU, a GPU, an FPGA, a DSP, a cryptographic processor, a microprocessor, a microcontroller, an ADC, an ASIC, or the like. According to the types of devices included in the logic chip 800, the semiconductor package 2a may be referred to as a server-oriented semiconductor package or a mobile-oriented semiconductor package.

In some embodiments, the semiconductor package 2a may further include an internal sealing material covering side and upper surfaces of the chip structure 1 and the processor chip 800 on the interposer substrate 700. In addition, the semiconductor package 2a may further include an external sealing material covering the interposer substrate 700 and the internal sealing material on the package substrate 600. The external sealing material and the internal sealing material may be formed together and thus indistinguishable. In some embodiments, the semiconductor package 2a may further include a heat sink covering the chip structure 1 and the processor chip 800 on the package substrate 600.

According to various embodiments, a method for manufacturing a semiconductor package in which a process is simplified and foreign matter on a surface of a semiconductor wafer is minimized, and a protective film used therein may be provided.

While various example embodiments have been shown and described above, it will be apparent to those skilled in the art that modifications and variations could be made without departing from the scope of the present inventive concept as defined by the appended claims.

What is claimed is:

1. A method comprising:
preparing a protective film including a base film and a protective layer laminated on a surface of the base film;
mounting the protective film on a semiconductor wafer having a rear surface attached to a dicing tape and a front surface positioned opposite to the rear surface, the protective layer being disposed on the front surface;
irradiating the rear surface of the semiconductor wafer through the dicing tape with a dicing laser that has a wavelength that may pass through the rear surface of the semiconductor wafer to focus on points that are within a body of the semiconductor wafer and that are spaced apart from the rear surface, wherein the irradiating forms deformation regions at the points within the body of the semiconductor wafer, wherein the dicing tape is not deformed by the dicing laser;
removing the base film of the protective film from the semiconductor wafer, wherein the protective layer remains on the front surface of the semiconductor wafer;
dividing the semiconductor wafer into individual semiconductor chips starting from the deformation regions of the body, wherein the protective layer is divided together with the semiconductor wafer and remains on the individual semiconductor chips; and
removing the protective layer from the individual semiconductor chips.

2. The method of claim 1, wherein the base film includes polyolefin (PO), polyethylene terephthalate (PET), polyethylene naphthalate (PEN), polyethylene ether ketone (PEEK), polyimide (PI), polyvinyl chloride (PVC), or ethylenevinyl acetate (EVA).

3. The method of claim 1, wherein the protective layer includes an oil-soluble resin or a water-soluble resin.

4. The method of claim 3, wherein the protective layer includes the oil-soluble resin, and the oil-soluble resin includes a polyurethane resin or a thermoplastic resin.

5. The method of claim 4, wherein the oil-soluble resin includes the polyurethane resin, and the polyurethane resin includes an urea group in which alcohol or amine is polymerized by reacting with isocyanate.

6. The method of claim 4, wherein the oil-soluble resin includes the thermoplastic resin, and the thermoplastic resin has a molecular weight from about 1000 Mw to about 100000 Mw.

7. The method of claim 3, wherein the protective layer includes the water-soluble resin, and the water-soluble resin includes polyvinyl alcohol (PVA), polyvinyl pyrrolidone (PVP), or an ionic polymer.

8. The method of claim 1, wherein the protective film further includes an adhesive layer disposed between the base film and the protective layer.

9. The method of claim 8, wherein, in the removing of the base film, the adhesive layer is removed together with the base film.

10. The method of claim 8, wherein the adhesive layer includes an acrylic resin.

11. The method of claim 1, wherein the dividing comprises extending the dicing tape to divide the semiconductor wafer into the individual semiconductor chips starting from the deformation regions as a starting point.

12. The method of claim 1, wherein the protective layer is divided together with the semiconductor wafer.

13. The method of claim 1, further comprising transmitting the individual semiconductor chips to a support substrate, before the removing of the protective layer.

14. The method of claim 1, wherein the removing of the protective layer is performed using an organic solvent or an inorganic solvent.

15. The method of claim 1, wherein the protective layer has a thickness from about 1 $\mu$m to about 50 $\mu$m.

16. A method comprising:
preparing a semiconductor wafer having a rear surface and a front surface positioned opposite to the rear surface, the semiconductor wafer including a rear pad adjacent to the rear surface, a front pad adjacent to the front surface, and a through-electrode electrically connecting the rear pad to the front pad;
mounting a protective film including a base film and a protective layer on the semiconductor wafer such that the protective layer is disposed on the front surface of the semiconductor wafer;
irradiating the rear surface of the semiconductor wafer with a dicing laser that has a wavelength that passes through the rear surface of the semiconductor wafer to focus on points that are within a body of the semiconductor wafer and that are spaced apart from the rear surface, wherein the irradiating forms deformation regions at the points within the body of the semiconductor wafer, wherein the dicing tape is not deformed by the dicing laser;
removing the base film of the protective film from the semiconductor wafer, wherein the protective layer remains on the front surface of the semiconductor wafer;
dividing the semiconductor wafer into individual semiconductor chips starting from the deformation regions of the body, wherein the protective layer is divided together with the semiconductor wafer and remains on the individual semiconductor chips; and
removing the protective layer from the individual semiconductor chips.

17. A method comprising:
preparing a first semiconductor wafer having a first rear surface and a first front surface positioned opposite to the first rear surface, the first semiconductor wafer comprising a first front pad to be disposed on the first front surface;
mounting a protective film including a base film and a protective layer on the first semiconductor wafer such that the protective layer is disposed on the first front surface of the first semiconductor wafer;
irradiating the first rear surface of the first semiconductor wafer with a dicing laser that has a wavelength that passes through the first rear surface of the first semiconductor wafer to focus on points that are within a body of the first semiconductor wafer and spaced apart from the first rear surface, wherein the irradiating forms deformation regions at the points within the body of the first semiconductor wafer, wherein the dicing tape is not deformed by the dicing laser;

removing the base film of the protective film from the first semiconductor wafer, wherein the protective layer remains on the first front surface of the first semiconductor wafer;

dividing the first semiconductor wafer into first semiconductor chips starting from the deformation regions of the body, wherein the protective layer is divided together with the first semiconductor wafer and remains on the first semiconductor chips;

removing the protective layer from the first semiconductor chips; and disposing the first semiconductor chips on a second semiconductor wafer having a second rear surface and a second front surface opposite to the second rear surface, the second semiconductor wafer including a second rear pad disposed on the second rear surface and a second front pad disposed on the second front surface, the first front pad being in direct contact with the second rear pad or with the second front pad.

18. The method of claim 17, wherein the first semiconductor wafer further includes a first front insulating layer surrounding the first front pad, the first front surface being formed by a surface of the first front insulating layer together with a surface of the first front pad, and wherein the second semiconductor wafer further includes:

a second rear insulating layer surrounding the second rear pad, the second rear insulating layer being formed by a surface of the second rear insulating layer together with a surface of the second rear pad; and a second front insulating layer surrounding the second front pad, the second front surface being formed by a surface of the second front insulating layer together with a surface of the second front pad.

19. The method of claim 18, wherein, in the disposing of the first semiconductor chips, the first front insulating layer is in direct contact with the second rear insulating layer or with the second front insulating layer.

* * * * *